(12) United States Patent
Gao

(10) Patent No.: US 11,716,830 B2
(45) Date of Patent: Aug. 1, 2023

(54) CARD LEVEL GRANULARITY OPERATION BASED MODULE DESIGN

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 133 days.

(21) Appl. No.: 17/471,018

(22) Filed: Sep. 9, 2021

(65) Prior Publication Data
US 2023/0074432 A1 Mar. 9, 2023

(51) Int. Cl.
*H05K 7/20* (2006.01)
(52) U.S. Cl.
CPC ..... *H05K 7/20254* (2013.01); *H05K 7/20272* (2013.01); *H05K 7/20781* (2013.01)
(58) Field of Classification Search
CPC ........... H05K 7/20254; H05K 7/20272; H05K 7/20781; H05K 7/20763; H05K 7/20772; H05K 7/208; H05K 7/20809; G06F 1/20
See application file for complete search history.

(56) References Cited

U.S. PATENT DOCUMENTS

| | | | | |
|---|---|---|---|---|
| 10,225,958 B1* | 3/2019 | Gao | ................... | H05K 7/20781 |
| 11,156,409 B2* | 10/2021 | Zhang | ..................... | F28D 15/04 |
| 2013/0098579 A1* | 4/2013 | Campbell | ................. | F28F 9/00 |
| | | | | 29/890.03 |
| 2014/0307389 A1* | 10/2014 | Arvelo | .................. | H01L 23/473 |
| | | | | 29/890.035 |
| 2016/0165755 A1* | 6/2016 | Bodenweber | .......... | H05K 1/181 |
| | | | | 165/80.2 |
| 2019/0364699 A1* | 11/2019 | Gao | .................... | H05K 7/20763 |
| 2022/0240421 A1* | 7/2022 | Zhang | ....................... | G06F 1/20 |
| 2022/0240422 A1* | 7/2022 | Heydari | ............. | H05K 7/20772 |

* cited by examiner

Primary Examiner — Stephen S Sul
(74) Attorney, Agent, or Firm — Womble Bond Dickinson (US) LLP

(57) ABSTRACT

The cooling module comprises a main supply connector, a main return connector, an internal cooling loop, a plurality of cooling plates, a base layer and a lid. The base layer includes a plurality of supply sub-connectors and return sub-connectors and a plurality of cooling areas corresponding to a plurality of cooling plates. Each cooling plate has a supply connector, a return connector and a contacting area. The plurality of supply sub-connectors and return sub-connectors are connected with the internal cooling loop. Each cooling area is to contact with a contacting area of a corresponding cooling plate. Each supply sub-connector is to be connected to a supply connector of the corresponding cooling plate, and each return sub-connector is to be connected to a return connector of the corresponding cooling plate. The corresponding cooling plate is to be removably attached with the base layer and to be serviced independently.

20 Claims, 9 Drawing Sheets

CARD LEVEL GRANULARITY OPERATION BASED MODULE DESIGN

FIELD OF THE INVENTION

Embodiments of the present disclosure relate generally to server and electronics cooling. More particularly, embodiments of the disclosure relate to electronics cooling modules.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

With the power density of a single processor or artificial intelligence (AI) acceleration device increasing significantly, the server packaging becomes more and more compact. In the liquid cooling server, it is difficult to reduce potential leaking locations. It is challenging to efficiently solve the impact of the liquid leakage in the liquid cooling server. Currently, there is no individual electronic card level cooling device serviceability for the server. When one electronic card cooling device fails, the entire server chassis may need to be removed and be serviced.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
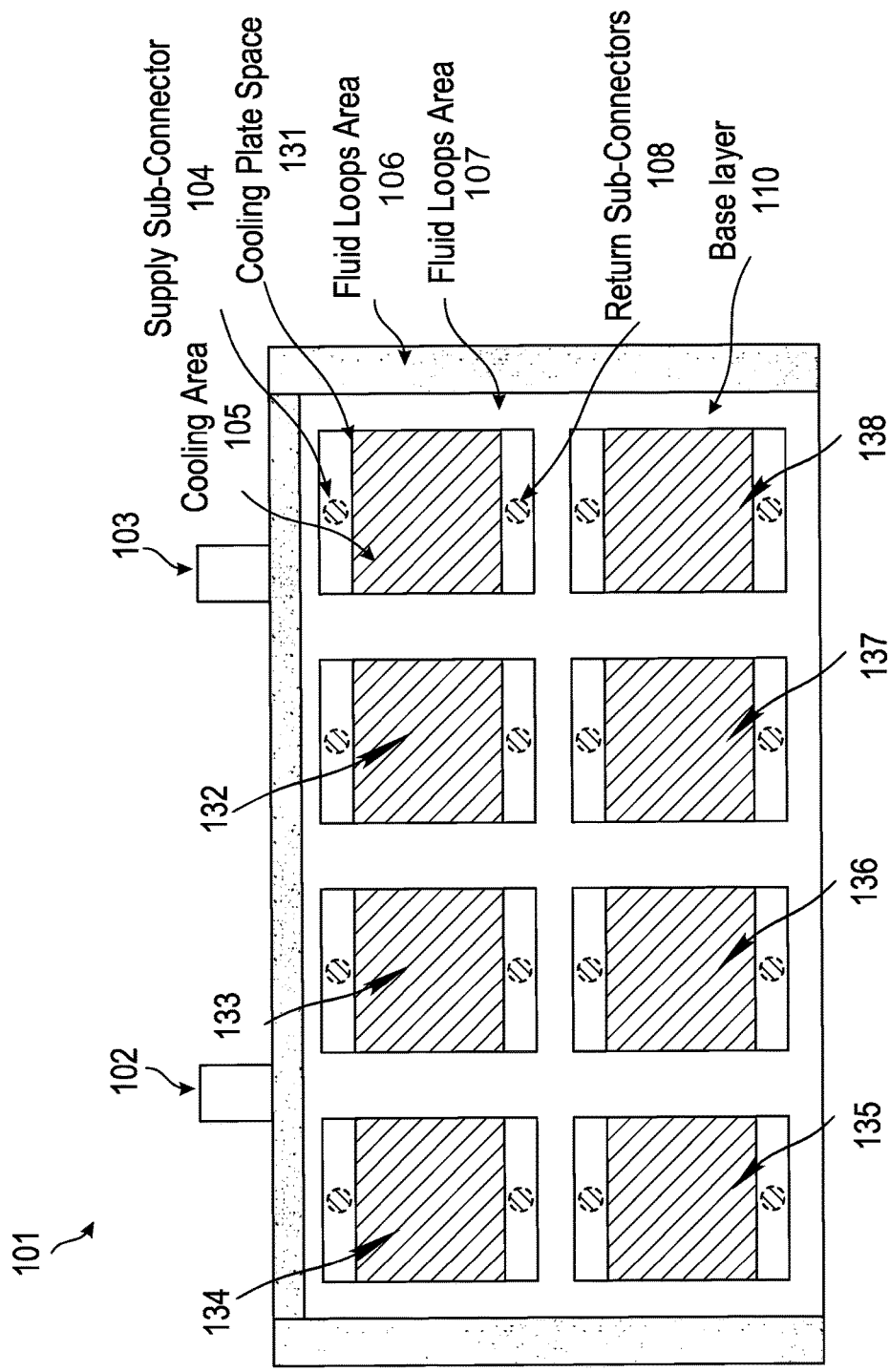
FIG. 1 is a diagram illustrating an example of top view a cooling module according to some embodiments.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, disclosed herein is a cooling module including a plurality of cooling plates, where all the fluid or liquid loops and manifolds as well as the connectors are integrated to a single cooling module. The terms "fluid" and "liquid" are used interchangeably in this disclosure. In addition, the cooling module may include dedicated locations for assembling and integrating the cooling plates. The location designed for a cooling plate may include a cooling area for thermal contacting and a sub-connector area to be connected to the connectors on the cooling plate. The connectors are to be self-mating connectors such that the connector can be connected and attached to the sub-connector area once the pressure is applied.

The individual cooling plate, e.g., for critical processors such as individual high performance accelerators, can be serviced independently. In this way, the cooling module may fulfill the individual cooling plate level fine-grained serviceability, while increasing the reliability of the cooling module at the same time. The combined module with cooling plates design may improve high power density thermal management for the critical processors, reduce potential leaking locations and offers ease of integration and manufacturing. Furthermore, cooling liquids are segregated with the electronics. Different system design and fluid management are enabled. Different types of liquids, either single phase or two phases are supported. Quick connections to the cooling plates within a module is enabled. The cooling module advantageously provide individual card level cooling device serviceability.

According to some embodiments, a cooling module includes a main supply connector and a main return connector connected to external cooling loops. The cooling module further comprises an internal cooling loop connected to the main supply connector and the main return connector. The base layer includes a plurality of supply sub-connectors and return sub-connectors and a plurality of cooling areas corresponding to a plurality of cooling plates. Each cooling plate includes a supply connector, a return connector and a contacting area. The plurality of supply sub-connectors and return sub-connectors are connected with the internal cooling loop. Each cooling area of the plurality of cooling areas is to contact with a contacting area of a corresponding cooling plate. Each supply sub-connector of the plurality of supply sub-connectors is to be connected to a supply connector of the corresponding cooling plate. Each return sub-connector of the plurality of return sub-connectors is to be connected to a return connector of the corresponding cooling plate. The corresponding cooling plate is to be removably attached with the base layer, and where the corresponding cooling plate is to be serviced independently.

According to some embodiments, a server chassis of an electronic rack includes a plurality of electronic components and one or more cooling modules disposed above the plurality of electronic components. Each cooling module includes a main supply connector and a main return connector connected to external cooling loops. Each cooling module further comprises an internal cooling loop connected to the main supply connector and the main return connector. Each cooling module further comprises a plurality of cooling plates. Each cooling plate of the plurality of cooling plates corresponds to one of the plurality of electronic components. Each cooling plate has a supply connector, a return connector and a contacting area.

The base layer includes a plurality of supply sub-connectors and return sub-connectors and a plurality of cooling areas corresponding to the plurality of cooling plates. The plurality of supply sub-connectors and return sub-connectors are connected with the internal cooling loop. Each cooling area of the plurality of cooling areas is to contact with a contacting area of a corresponding cooling plate and a surface of a corresponding electronic component. Each supply sub-connector of the plurality of supply sub-connectors is to be connected to a supply connector of the corresponding cooling plate. Each return sub-connector of the plurality of return sub-connectors is to be connected to a return connector of the corresponding cooling plate. The corresponding cooling plate is to be removably attached with the base layer, and wherein the corresponding cooling plate is to be serviced independently.

According to some embodiments, an electronic rack of a data center includes a plurality of server chassis arranged in a stack. Each server chassis comprises a plurality of electronic components and one or more cooling modules disposed above the plurality of electronic components. Each cooling module includes a main supply connector and a main return connector connected to external cooling loops. Each cooling module further comprises an internal cooling loop connected to the main supply connector and the main return connector. Each cooling module further comprises a plurality of cooling plates. Each cooling plate of the plurality of cooling plates corresponds to one of the plurality of electronic components. Each cooling plate has a supply connector, a return connector and a contacting area.

The base layer includes a plurality of supply sub-connectors and return sub-connectors and a plurality of cooling areas corresponding to the plurality of cooling plates. The plurality of supply sub-connectors and return sub-connectors are connected with the internal cooling loop. Each cooling area of the plurality of cooling areas is to contact with a contacting area of a corresponding cooling plate and a surface of a corresponding electronic component. Each supply sub-connector of the plurality of supply sub-connectors is to be connected to a supply connector of the corresponding cooling plate, each return sub-connector of the plurality of return sub-connectors is to be connected to a return connector of the corresponding cooling plate. The corresponding cooling plate is to be removably attached with the base layer, and wherein the corresponding cooling plate is to be serviced independently.

In one embodiment, each of the plurality of cooling plates is disposed above the base layer and configured to be pushed down to be connected to the base layer by connecting a supply connector and a return connector to a corresponding supply sub-connector and a corresponding return sub-connector in the base layer. In one embodiment, each of the plurality of cooling plates is configured to be pulled up to be disconnected from the base layer by disconnecting a supply connector and a return connector from a corresponding supply sub-connector and a corresponding return sub-connector in the base layer.

In one embodiment, the main supply connector is to receive a cooling liquid from the external loops. The main return connector is to return warmer cooling liquid to the external cooling loop. In one embodiment, the internal cooling loop includes one or more liquid supply lines and one or more liquid return lines to distribute a cooling liquid to the plurality of cooling plates. In one embodiment, for each of the plurality of cooling plates, a corresponding supply sub-connector in the base layer is connected with one of the one or more liquid supply lines to receive the cooling liquid, and a supply connector of a cooling plate is to receive the cooling liquid from the corresponding supply sub-connector in the base layer, and wherein the cooling liquid becomes a warmer cooling liquid after flowing through the cooling plate. d.

In one embodiment, for each of the plurality of cooling plates, a return connector of the cooling plate is to return the warmer cooling liquid to a corresponding return sub-connector in the base layer. The corresponding return sub-connector in the base layer is connected with one of the one or more liquid return lines. Each of the plurality of cooling areas of the base layer is further to contact a surface of a corresponding electronic component. Each of the plurality of cooling plates, a supply connector, a return connector and a contacting area of a cooling plate are in a same surface. At least one of the plurality of cooling plates includes a double fluid operating based cooling plate. At least one of the plurality of cooling plates is configured to be operated with two fluids in parallel.

FIG. 1 is a diagram 100 illustrating an example of a cooling module 101 according to some embodiments. The cooling module 101 may include two main connectors, a main supply connector 102 and a main return connector 103, which are designed for connecting with external cooling loops. The cooling module 101 further includes one or more internal cooling loops including fluid loop area 106 and fluid loop area 107, which are connected to the main supply connector 102 and the main return connector 103. The cooling module 101 further includes a base layer 110, which includes multiple cooling areas, e.g., 131-138. The multiple cooling areas correspond to multiple electronic components. Each cooling area may correspond to one of the multiple electronic components. Though eight cooling areas are illustrated in FIG. 1, the cooling module may include any number of cooling areas. In addition, the layout of the cooling areas is shown for illustration purpose only. Other layouts may also be applied. The one or more internal cooling loops may be either built-in loops in the cooling module or a separated module integrated to the cooling module.

The cooling module 101 may include multiple cooling plates (not shown), a base layer 110 and a top lid (not shown). For example, the cooling plate (not shown) may be placed in the cooling plate place 131 in the base layer 110. The base layer 110 may include multiple cooling areas (e.g., 105) for contacting with the cooling plates and the electronic components, multiple supply sub-connectors (e.g., 10) and multiple return sub-connectors (e.g., 108). Both the supply sub-connectors (e.g., 104) and the return sub-connectors (e.g., 108) are connected with the internal cooling loop. The cooling area 105, the supply sub-connector 104 and the return sub-connector 108 are designed for adding the cooling plate. The cooling area 105 is to be directly contacting with both the surface of the electronic component, e.g., a processors die, and the contacting area of the cooling plate. The two sub-connectors 104, 108 are designed for connecting with the cooling plate. The cooling plate may have a supply port and a return port without any additional hoses. In addition, the supply port, the return port and the contacting area of the cooling plate may be designed on the same surface.

The supply sub-connector 104 is configured to be connected to the supply connector of the cooling plate, and the return sub-connector 108 is configured to be connected to the return connector of the cooling plate. The cooling plate is configured to be removably connected with the base layer 110, which is underneath the cooling plate space 131 once the cooling plate is attached onto the cooling plate space 131, through the connectors 104, 108. Thus, the cooling plate is configured to be serviced independently, without removing the entire cooling module or the entire chassis.

Figure 2:
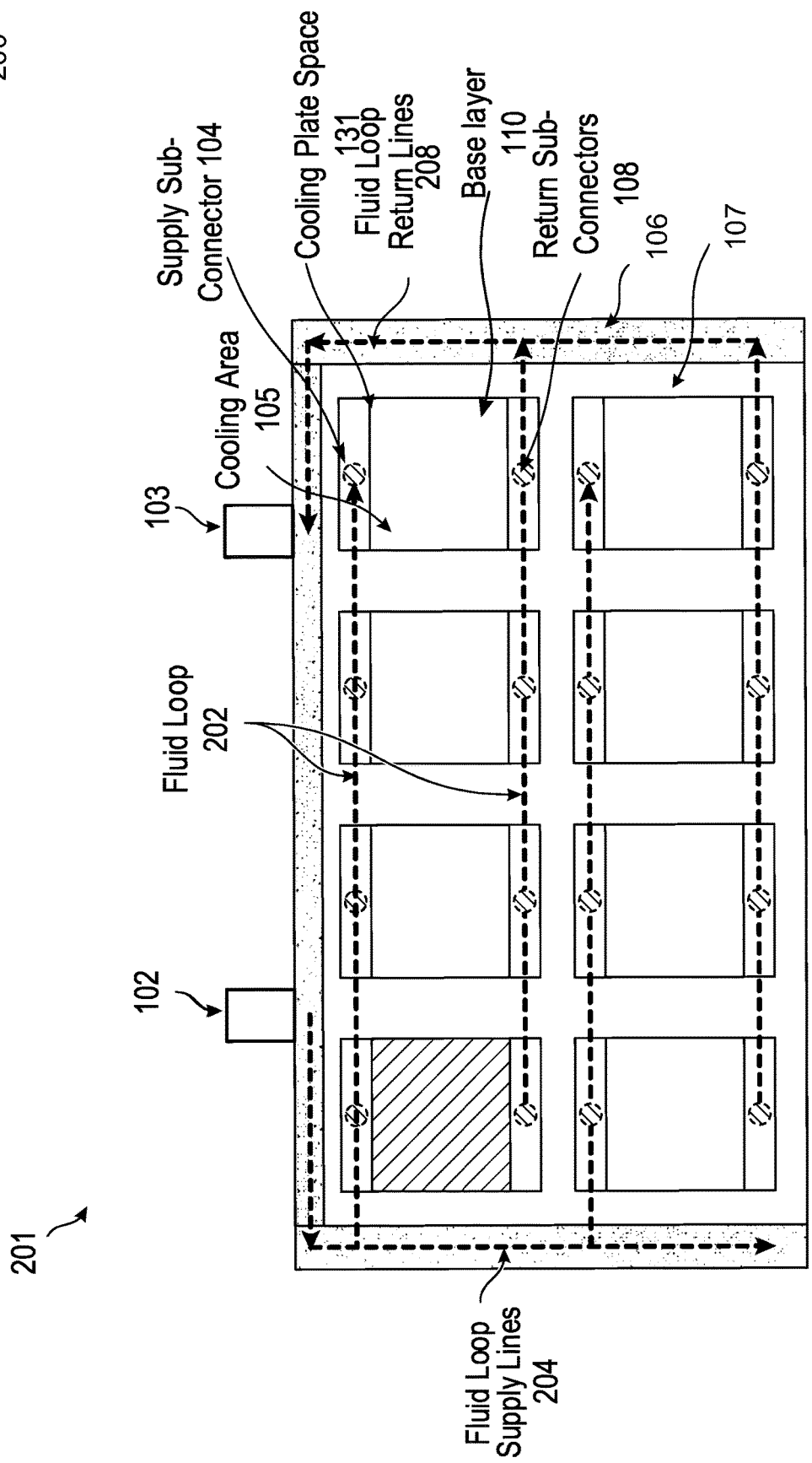
FIG. 2 is a diagram illustrating an example of top view of cooling loops of a cooling module according to some embodiments.

FIG. 2 is a diagram 200 illustrating an example of cooling loops 202 of a cooling module 201 according to some embodiments. The one or more internal cooling loops of the cooling module may be arranged in different manners. In one embodiment, the one or more internal cooling loops may be built-in with the cooling module. In another embodiment, the one or more internal cooling loops may form a separated module and be integrated to the cooling module.

Referring to FIG. 2, the main supply connector 102 may receive a cooling liquid from the external loops, and the main return connector 103 may return warmer cooling liquid to the external cooling loop. The cooling liquid extracts the heat generated from the cooling plates and transforms into warmer or hotter cooling liquid. The cooling module 201 may include an internal cooling loop 202 to distribute the cooling liquid or fluid to the cooling plates. The fluid or liquid supply, distribution, and return may be enabled in the cooling module 201 in the fluid loop areas 106, 107. The internal cooling loop 202 may include one or more liquid supply lines 204 and one or more liquid return lines 208 to distribute the cooling liquid to the cooling plates. The one or more liquid supply lines 204 may be connected with the supply main connector 102, and the one or more liquid return lines 208 may be connected with the return main connector 103.

As illustrated in FIG. 2, part of the internal cooling loop 202 may be built in with the modules for the sub-connectors. The supply sub-connector 104 in the base layer 110 may be connected with one of the one or more liquid supply lines 204 to receive the cooling liquid. The supply connector of the cooling plate may receive the cooling liquid from the supply sub-connector 104 in the base layer 110. The cooling liquid may become a warmer cooling liquid after flowing through the cooling plate.

The return connector of the cooling plate may subsequently return the warmer cooling liquid to the return sub-connector 108 in the base layer 110. The return sub-connector 108 may be connected with one of the one or more liquid return lines 208 to return the warmer cooling liquid. The one or more liquid return lines 208 may be connected with the return main connector 103 to return the warmer cooling liquid to external loops.

Figure 3:
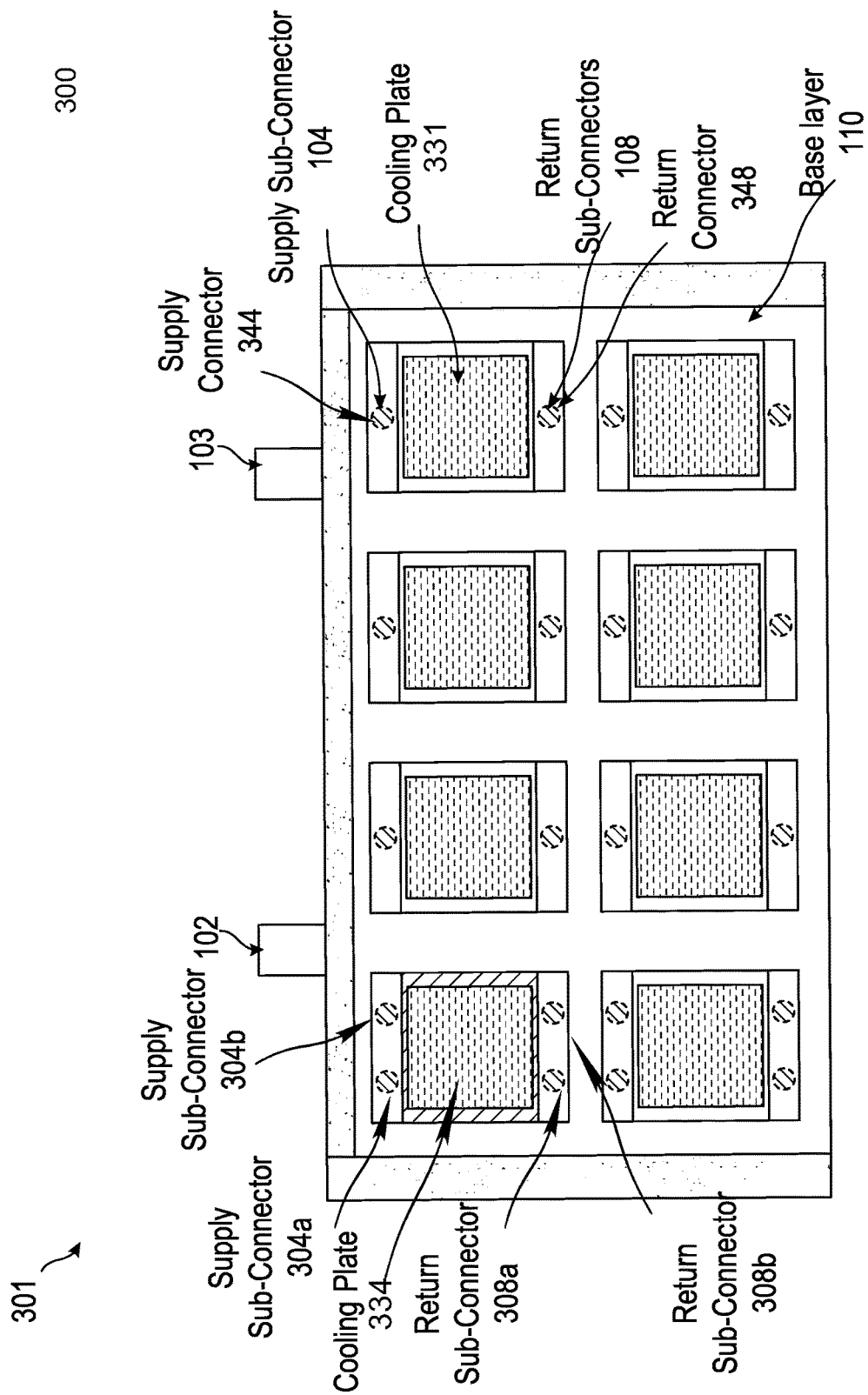
FIG. 3 is a diagram illustrating an example of top view of a cooling module attached with cooling plates according to some embodiments.

FIG. 3 is a diagram 300 illustrating an example of a cooling module 301 attached with cooling plates according to some embodiments. The cooling module 301 may include multiple cooling areas to receive multiple cooling plates, e.g., the cooling plate 331, 334. The specific layout of the cooling areas can be configured dependent upon the specific locations of the electronic devices (e.g., processors) mounted on the printed circuit board (also referred to as a motherboard). The cooling module 301 may include the cooling plates disposed above a base layer 110. For example, the cooling module 301 may include the cooling plate 331 disposed above the base layer 110.

The cooling module 301 may also include the cooling plate 334 disposed above the base layer 110. Each cooling plate (e.g., 331) may have a supply connector (e.g., 344) and a return connector (e.g., 348). The cooling plates (e.g., 331, 334) may be pushed down to be quickly connected with the corresponding base layers (e.g., 110) by connecting the supply connector (e.g., 344) and the return connector (e.g., 348) to the supply sub-connector (e.g., 104) and the return sub-connector (e.g., 108) in the base layer (e.g., 110). For example, the supply sub-connector 104 is configured to be connected to the supply connector of the cooling plate 331, and the return sub-connector 108 is configured to be connected to the return connector of the cooling plate 331. The connectors (e.g., 104, 108, 344, 348) are configured to be self-mating ones such that the connectors can be connected and attached once pressure is applied.

The cooling plates (e.g., 331) are configured to be removably attached with the base layer (e.g., 110) through the connectors (e.g., 104, 108, 344, 348). The cooling plates (e.g., 331) may be pulled up to be quickly disconnected from the corresponding base layers (e.g., 110) by disconnecting the supply connector (e.g., 344) and the return connector (e.g., 348) from the supply sub-connector (e.g., 104) and the return sub-connector (e.g., 108) in the base layer (e.g., 110). The cooling plates (e.g., 331) are connected to the base layers (e.g., 110) when the corresponding supply connectors and the return connectors are connected with the supply sub-connectors and the return sub-connectors. The cooling plates (e.g., 331) are disconnected from the base layers (e.g., 110) when the corresponding supply connectors and the return connectors are disconnected from the supply sub-connectors and the return sub-connectors.

The cooling plates (e.g., 331) are configured to work in a "plug and play" manner. Thus, each of the cooling plates is configured to be serviced independently, without removing the entire cooling module or the entire chassis. By this way, the cooling module may fulfill the individual cooling plate level fine-grained serviceability, thereby improving high power density thermal management for the critical processors. Furthermore, cooling liquids are segregated with the electronics. Different system design and fluid management are enabled. Different types of liquids, either single phase or two phases are supported. Quick connections to the cooling plates within a module is enabled. The cooling module advantageously provide individual card level cooling device serviceability and increased reliability of the server chassis.

As illustrated in FIG. 3, the cooling plates may include a double fluid operating based cooling plate 334. The double fluid operating based cooling plate 334 is enabled by the cooling module 301. The cooling module 301 may include two sets of supply sub-connectors and return supply sub-connectors. The supply sub-connector 304a and the return supply sub-connector 308a may operate for one liquid or fluid, while the supply sub-connector 304b and the return supply sub-connector 308b may operate for a different liquid or fluid. The cooling module 301 may enable different system design and fluid management. In order for the cooling plate 334 to be able to be attached onto the cooling module 301, there may be two sets of liquid supply lines and liquid return lines corresponding to the two sets of supply sub-connectors and return supply sub-connectors.

Figure 4:
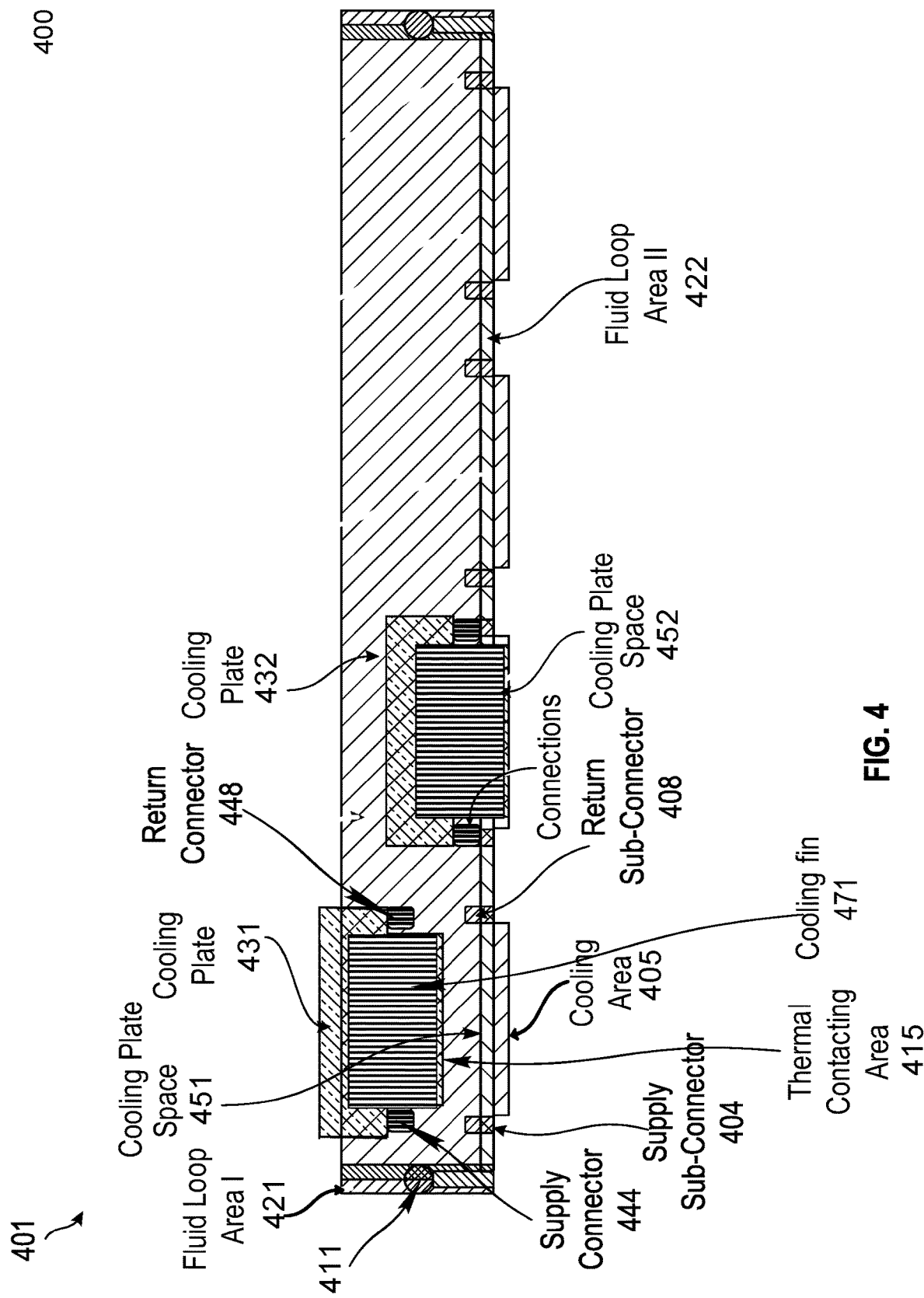
FIG. 4 is a diagram illustrating an example of side view of a cooling module in a process of being assembled with cooling plates according to some embodiments.

FIG. 4 is a diagram 400 illustrating an example of a cooling module 401 in a process of being assembled with cooling plates according to some embodiments. The cooling module 401 may include multiple cooling plates (e.g., 431, 432). Each of the cooling plates (e.g., 431) may include a thermal contracting area (e.g., 415), a supply connector (e.g., 444) and a return connector (e.g., 448). Referring to FIG. 4, the thermal contracting area (e.g., 415) and the supply connector (e.g., 444) and the return connector (e.g., 448) may be disposed on the same surface.

As illustrated in FIG. 4, the cooling plate 431 is not being installed to the cooling plate place 451 yet. The cooling plate 431 may be pushed down to be quickly connected with the base layer by connecting the supply connector 444 and the return connector 448 to the supply sub-connector 404 and the return sub-connector 408 in the base layer. The thermal contacting area 415 of the cooling plate 431 is to be attached with the cooling area 405 on the cooling module 461. The cooling liquid or fluid may be recirculated with the connections (e.g., 411) to the fluid loop area I 421 and the fluid loop area II 422. The cooling area 405 may also be the contacting area of the cooling module and corresponding electronics. The cooling plate may include a cooling fin 471, as illustrated in FIG. 4.

Referring to FIG. 4, the cooling plate 432 has been installed to the cooling plate place 452. The supply connector and the return connector of the cooling plate are connected to the supply sub-connector and the return sub-connector in the base layer. The cooling plate 432 is removably attached to the base layer.

Figure 5:
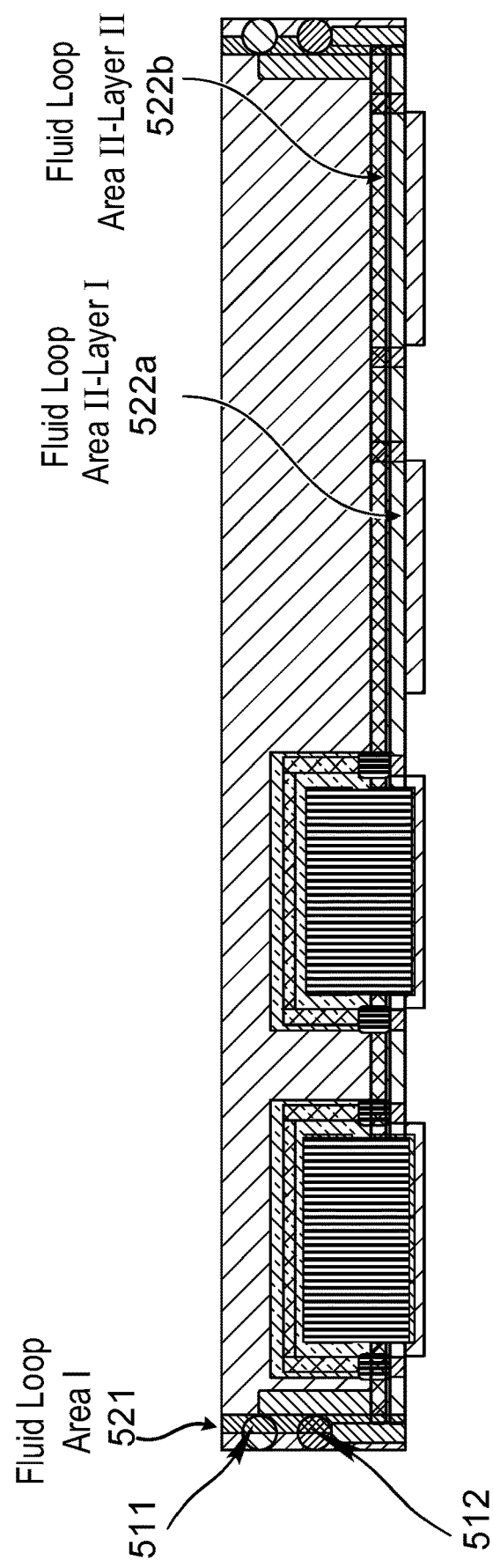
FIG. 5 is a diagram illustrating an example of a cooling module to be operated with two types of liquids in parallel according to some embodiments.

FIG. 5 is a diagram 500 illustrating an example of a cooling module 501 to be operated with two types of liquids in parallel according to some embodiments. As illustrated in FIG. 5, two connectors 511, 512 may be used to receive or return two types of liquids. The internal cooling loop of the cooling module may include a fluid loop area I 521 and a fluid loop area II including two layers, the fluid loop area II layer I 522a and the fluid loop area II layer II 522b. The fluid loop area II layer I 522a and the fluid loop area II layer II 522b may be configured the distribute or transport two types of liquids.

Figure 6A:
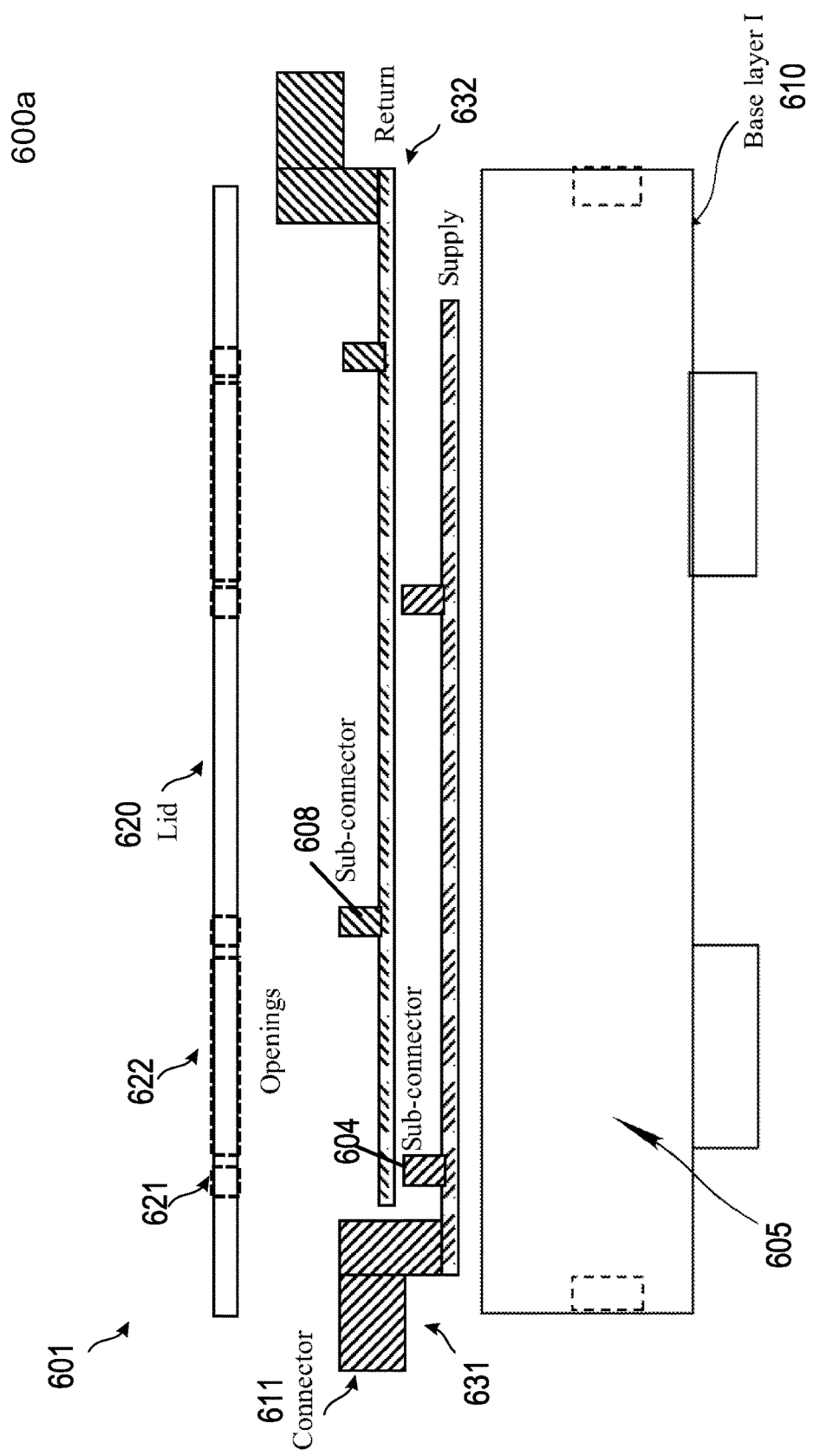
FIG. 6A is a diagram illustrating an example of an exploded view of a cooling module according to some embodiments.
Figure 6B:
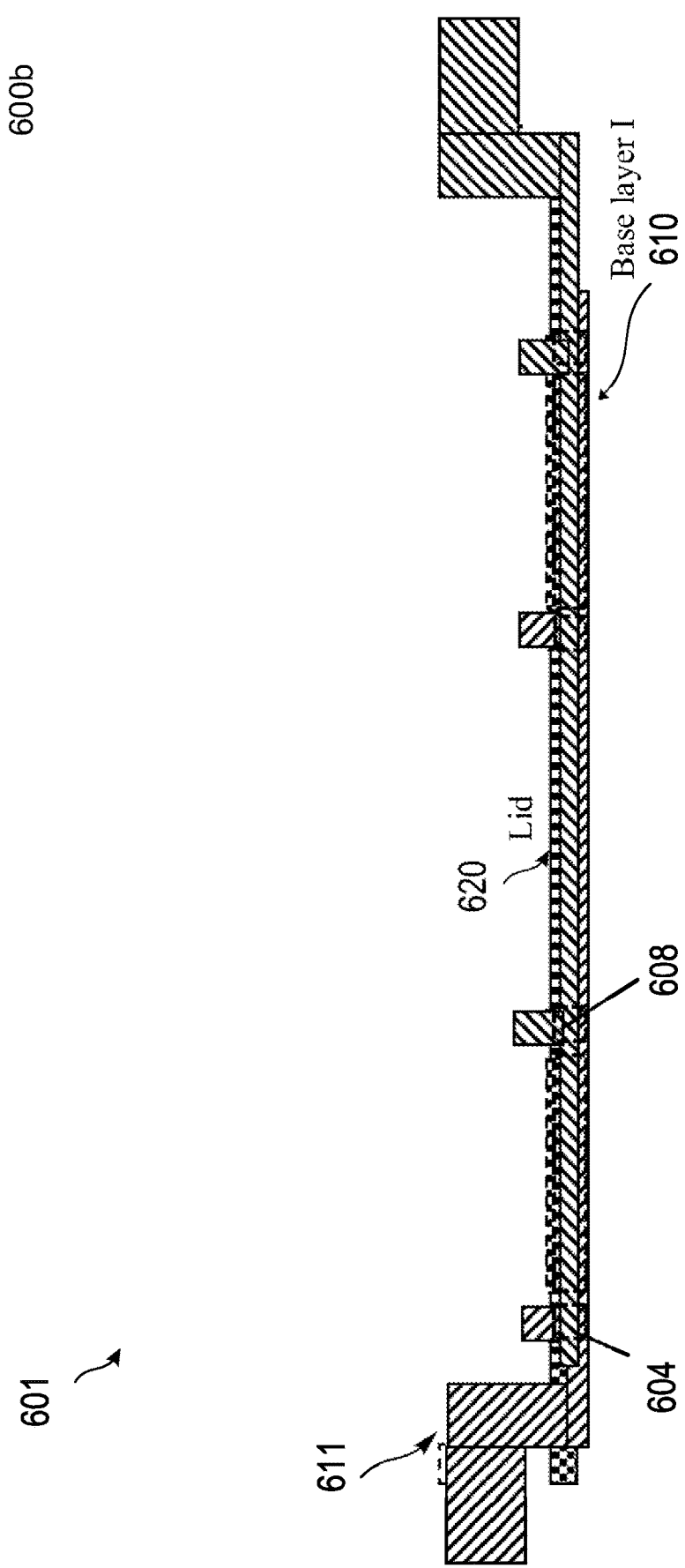
FIG. 6B is a diagram illustrating an example of a side view of an integrated cooling module according to some embodiments.
Figure 6C:
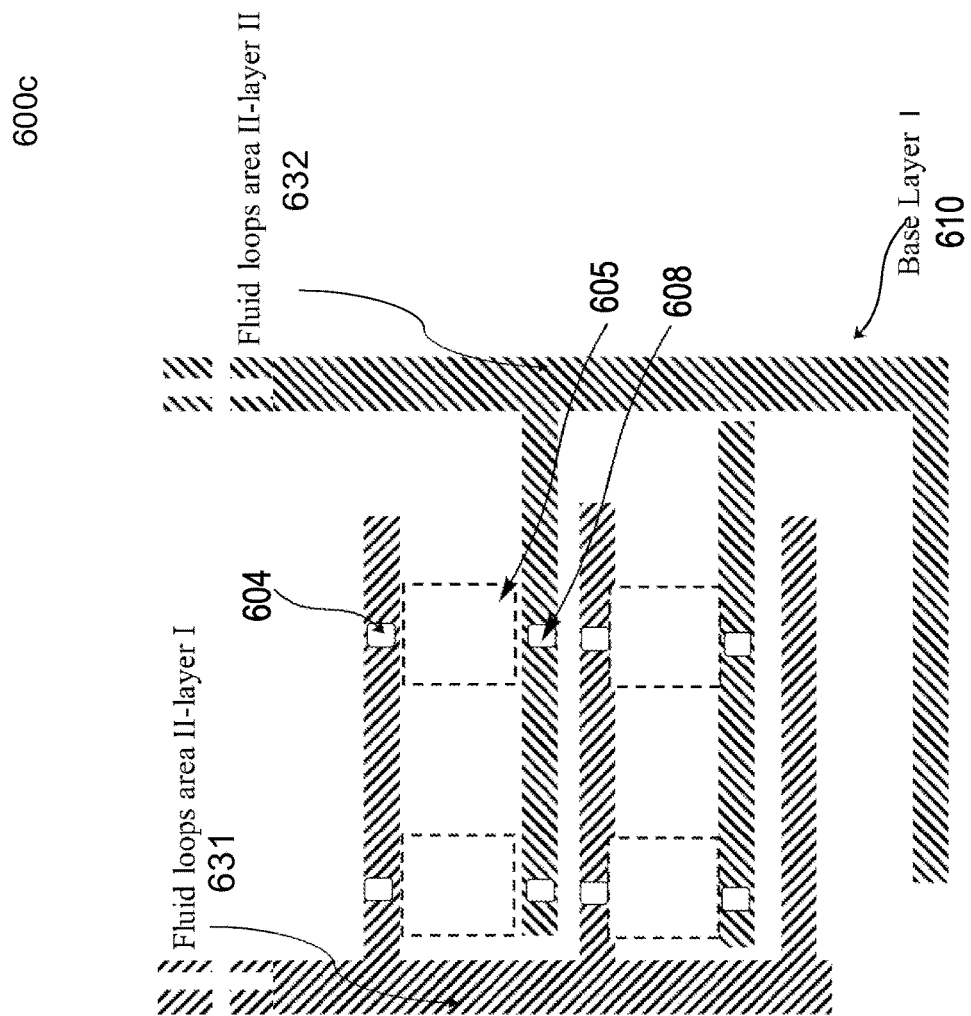
FIG. 6C is a diagram illustrating an example of a top view of a cooling module according to some embodiments.
Figure 6C:
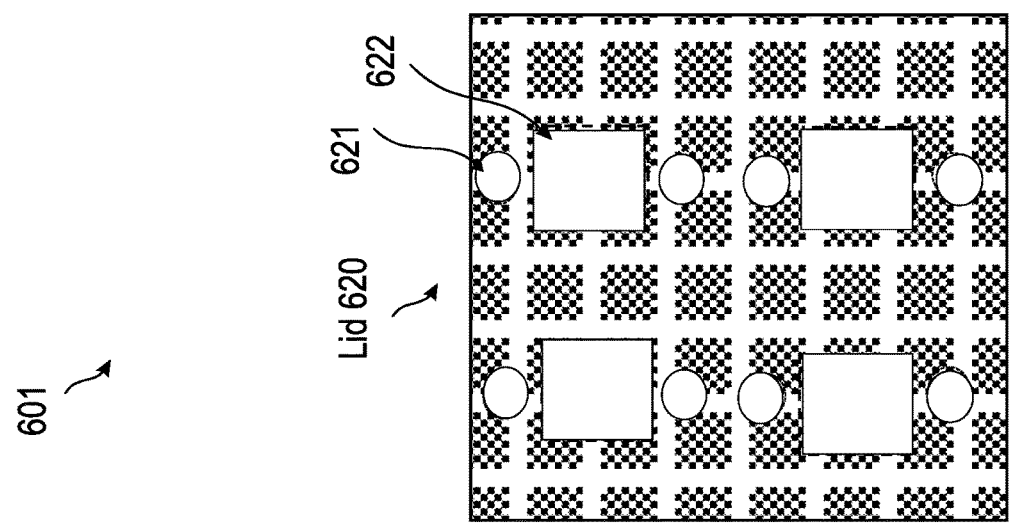

FIG. 6A is a diagram 600a illustrating an example of an exploded view of a cooling module 601 according to some embodiments. FIG. 6B is a diagram 600b illustrating an example of a side view of the cooling module 601 after being integrated according to some embodiments. FIG. 6C is a diagram 600c illustrating an example of a top view of the cooling module 601 according to some embodiments. Referring to FIGS. 6A-6C, the cooling module 601 may include a base layer I 610. The base layer I 610 may include the cooling areas (e.g., 605). The fluid connectors may include the connector 611, the supply sub-connector 604 and the return sub-connector 608.

The connector 611 may be connected to an internal cooling loop. The internal cooling loop may include supply lines and return lines for the cooling liquid or fluid. The cooling loop, the connector 611, the supply sub-connector 604 and the return sub-connector 608 are to be integrated to the base layer I 610. The cooling module 601 may include loop area II layer I 631 which includes liquid supply lines, the connectors and the supply sub-connectors. The cooling module 601 may also include loop area II layer II 632 which includes liquid return lines, the connectors and the return sub-connectors.

The cooling module 601 may include a top lid 620. The base layer I 610 and the top lid 620 may form a sealed unit with openings for the fluid connectors. The top lid 620 may be disposed to seal the supply lines and the return lines. The cooling module 601 may include multiple cooling plates. Though four cooling plates are illustrated in FIG. 6C, the number of cooling plates in the cooling module may be any number, as long as the cooling plates may fit inside the cooling module. The top lid 620 may include openings for the sub-connectors (e.g., 604, 608) and openings for the cooling areas (e.g., 605) of the cooling plates. The sub-connectors (e.g., 604, 608) and the cooling areas (e.g., 605) are exposed to the cooling plates.

The base layer I 610, the connector 611, the sub-connectors (e.g., 604, 608), the cooling loop, and the top lid 620 may be integrated. The cooling loop may include the supply lines and the return lines in the fluid loops area II layer I 631 and the fluid loops area II layer II 632. The cooling plates may be integrated with the top lid 620, the sub-connectors (e.g., 604, 608) and the base layer I 610. The configurations disclosed herein are only a few examples. Different fluid loop modules may be integrated.

Different design and development approach may be used without departure from the scope of the disclosure. For example, if the cold plate, e.g., as shown in FIG. 3, may need to work with different connectors, or different numbers of connectors, the configuration of 631, 632 may be changed accordingly. FIGS. 6A-6C illustrate an example of a process of manufacturing and assembling of the cooling module. Please note that the cooling plates are not shown in FIGS. 6A, 6C. However, there may be other approaches to manufacturing and assembling of the cooling module.

Figure 7:
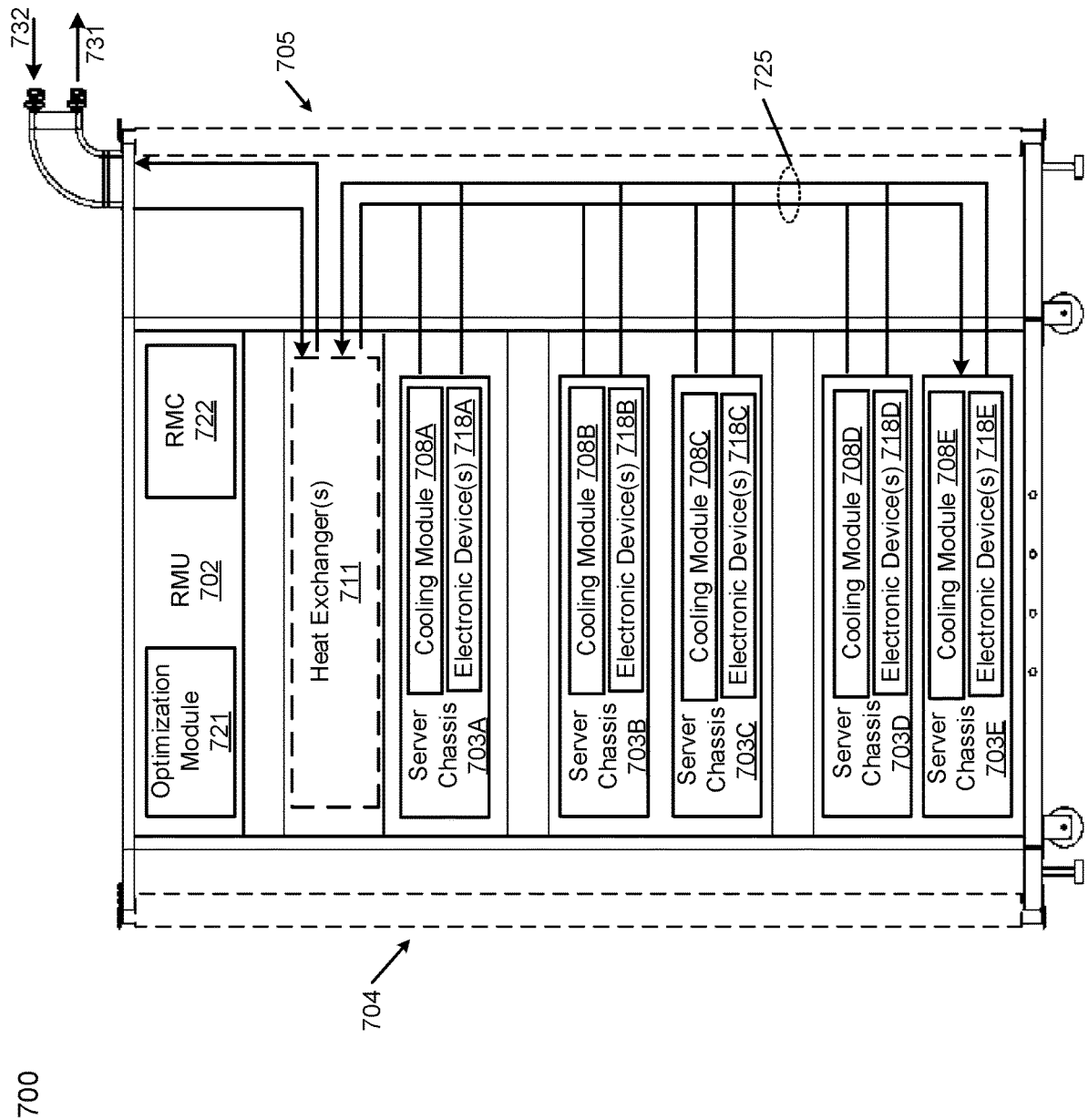
FIG. 7 is a block diagram illustrating an example of an electronic rack of a data center.

FIG. 7 is block diagram illustrating an electronic rack 700 according to one embodiment. Electronic rack 700 may represent any of the electronic racks as described throughout this application. According to one embodiment, electronic rack 700 includes, but is not limited to, heat exchanger 711, rack management unit (RMU) 702, liquid cooling loop 725, and one or more server chassis 703A-703E (collectively referred to as server chassis 703). Server chassis 703 can be inserted into an array of server slots (e.g., standard shelves) respectively from frontend 704 or backend 705 of electronic rack 700.

Note that although there are five server chassis 703A-703E shown here, more or fewer server chassis may be maintained within electronic rack 700. Also note that the particular positions of heat exchanger 711, RMU 702, and/or server chassis 703 are shown for the purpose of illustration only; other arrangements or configurations of heat exchanger 711, RMU 702, and/or server chassis 703 may also be implemented. In one embodiment, electronic rack 700 can be either open to the environment or partially contained by a rack container, as long as the cooling fans can generate airflows from the frontend to the backend.

The one or more server chassis 703A-703E (703) may include one or more cooling modules 708A-708E (collectively referred to as cooling modules 708) and one or more electronic devices 718A-718E (collectively referred to as electronic devices 718). Each server chassis (703A, 703B, 703C, 703D, or 703E) comprises a plurality of electronic components and a cooling module (708A, 708B, 708C, 708D, or 708E) disposed above the plurality of electronic components. In one embodiment, each server chassis may comprise a plurality of electronic components and one or more cooling modules.

In one embodiment, heat exchanger 711 may be a liquid-to-liquid heat exchanger. Heat exchanger 711 includes a first loop with inlet and outlet ports having a first pair of liquid connectors coupled to external liquid supply/return lines 731-732 to form a primary loop. The connectors coupled to the external liquid supply/return lines 731-732 may be disposed or mounted on backend 705 of electronic rack 700. The liquid supply/return lines 731-732, also referred to as room liquid supply/return lines, may be coupled to an external cooling system.

In addition, heat exchanger 711 further includes a second loop with two ports having a second pair of liquid connectors coupled to liquid cooling loop 725 to form a secondary loop, which may include a supply manifold (also referred to as a rack liquid supply line or rack supply manifold) to supply cooling liquid to server chassis 703 and a return manifold (also referred to as a rack liquid return line or rack return manifold) to return warmer liquid back to heat exchanger 711. Note that heat exchanger 711 can be any kind of heat exchangers commercially available or customized ones. Thus, the details of heat exchanger 711 will not be described herein.

Each of server chassis 703 may include one or more information technology (IT) components (e.g., electronic devices such as processors, memory, and/or storage devices). In one embodiment, in at least some of the server chassis 703, a cooling module is included. The cooling module includes a main supply connector and a main return connector connected to external cooling loops through the liquid cooling loop 725. The cooling module further comprises an internal cooling loop connected to the main supply connector and the main return connector. The cooling module further comprises a plurality of cooling plates.

Note that some of the server chassis 703 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Some of the sever chassis 703 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 703 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 700 further includes optional RMU 702 configured to provide and manage power supplied to servers 703 and heat exchanger 711. RMU 702 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack 700.

In one embodiment, RMU 702 includes optional optimization module 721 and rack management controller (RMC) 722. RMC 722 may include a monitor to monitor operating status of various components within electronic rack 700, such as, for example, computing nodes 703, heat exchanger 711, and the fan modules. Specifically, the monitor receives operating data from various sensors representing the operating environments of electronic rack 700. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 702.

Based on the operating data, optimization module 721 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 722 configures the liquid pump and cooling fans of the fan modules based on the optimal pump speeds and fan speeds.

In one embodiment, the electronic rack 700 doesn't include the heat exchange 711, and the liquid cooling loop 725 may directly connect with the external liquid supply/return lines 731 and 732.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling module comprising:
   a main supply connector and a main return connector connected to external cooling loops;
   an internal cooling loop connected to the main supply connector and the main return connector;
   a base layer including a plurality of supply sub-connectors and return sub-connectors and a plurality of cooling areas corresponding to a plurality of cooling plates, each cooling plate having a supply connector, a return connector, and a contacting area, wherein the plurality of supply sub-connectors and return sub-connectors are connected with the internal cooling loop, wherein each of the cooling areas is to contact with a contacting area of a corresponding cooling plate, wherein each of the plurality of supply sub-connectors is to be connected to a supply connector of the corresponding cooling plate, each return of the return sub-connectors is to be connected to a return connector of the corresponding cooling plate; and a lid with openings for the plurality of supply sub-connectors and return sub-connectors and the plurality of cooling areas in the base layer.

2. The cooling module of claim 1, wherein each of the plurality of cooling plates is disposed above the base layer and configured to be pushed downwardly to connect with the base layer by connecting a supply connector and a return connector to a corresponding supply sub-connector and a corresponding return sub-connector in the base layer.

3. The cooling module of claim 1, wherein each of the plurality of cooling plates is configured to be pulled upwardly to disconnect from the base layer by disconnecting a supply connector and a return connector from a corresponding supply sub-connector and a corresponding return sub-connector in the base layer.

4. The cooling module of claim 1, wherein the main supply connector is configured to receive a cooling liquid from the external loops, and wherein the main return connector is configured to return warmer cooling liquid to the external cooling loops.

5. The cooling module of claim 1, wherein the internal cooling loop includes one or more liquid supply lines and one or more liquid return lines to distribute a cooling liquid to the plurality of cooling plates.

6. The cooling module of claim 5, wherein, for each of the plurality of cooling plates, a corresponding supply sub-connector in the base layer is connected with one of the one or more liquid supply lines to receive the cooling liquid, and a supply connector of a cooling plate of the plurality of cooling plates is to receive the cooling liquid from the corresponding supply sub-connector in the base layer, and wherein the cooling liquid becomes a warmer cooling liquid after flowing through the cooling plate.

7. The cooling module of claim 6, wherein, for each of the plurality of cooling plates, a return connector of the cooling plate is to return the warmer cooling liquid to a corresponding return sub-connector in the base layer, and wherein the corresponding return sub-connector in the base layer is connected with one of the one or more liquid return lines.

8. The cooling module of claim 1, wherein each of the plurality of cooling areas of the base layer is further to contact a surface of a corresponding electronic component.

9. The cooling module of claim 1, wherein, for each of the plurality of cooling plates, the supply connector, the return connector and the contacting area of a cooling plate of the plurality of cooling plates are in a same surface.

10. The cooling module of claim 1, wherein at least one of the plurality of cooling plates includes a double fluid operating based cooling plate.

11. The cooling module of claim 1, wherein at least one of the plurality of cooling plates is configured to be operated with two fluids in parallel.

12. A server chassis of an electronic rack, comprising:
a plurality of electronic components; and
one or more cooling modules disposed above the plurality of electronic components, each cooling module including:
a main supply connector and a main return connector connected to external cooling loops,
an internal cooling loop connected to the main supply connector and the main return connector,
a plurality of cooling plates, each cooling plate of the plurality of cooling plates corresponding to one of the plurality of electronic components, each cooling plate having a supply connector, a return connector and a contacting area,
a base layer including a plurality of supply sub-connectors and return sub-connectors and a plurality of cooling areas corresponding to the plurality of cooling plates, wherein the plurality of supply sub-connectors and return sub-connectors are connected with the internal cooling loop, wherein each of the plurality of cooling areas is to contact with a contacting area of a corresponding cooling plate and a surface of a corresponding electronic component, wherein each of the plurality of supply sub-connectors is to be connected to a supply connector of the corresponding cooling plate, each of the return sub-connectors is to be connected to a return connector of the corresponding cooling plate, and
a lid with openings for the plurality of supply sub-connectors and return sub-connectors and the plurality of cooling areas in the base layer.

13. The server chassis of claim 12, wherein each of the plurality of cooling plates is disposed above the base layer and configured to be pushed downwardly to connect with the base layer by connecting a supply connector and a return connector to a corresponding supply sub-connector and a corresponding return sub-connector in the base layer.

14. The server chassis of claim 12, wherein each of the plurality of cooling plates is configured to be pulled upwardly to disconnect from the base layer by disconnecting a supply connector and a return connector from a corresponding supply sub-connector and a corresponding return sub-connector in the base layer.

15. The server chassis of claim 12, wherein the internal cooling loop includes one or more liquid supply lines and one or more liquid return lines to distribute a cooling liquid to the plurality of cooling plates.

16. The server chassis of claim 15, wherein, for each of the plurality of cooling plates, a corresponding supply sub-connector in the base layer is connected with one of the one or more liquid supply lines to receive the cooling liquid, and a supply connector of a cooling plate of the plurality of cooling plates is to receive the cooling liquid from the corresponding supply sub-connector in the base layer, and wherein the cooling liquid becomes a warmer cooling liquid after flowing through the cooling plate.

17. The server chassis of claim 16, wherein, for each of the plurality of cooling plates, a return connector of the cooling plate is to return the warmer cooling liquid to a corresponding return sub-connector in the base layer, and wherein the corresponding return sub-connector in the base layer is connected with one of the one or more liquid return lines.

18. An electronic rack of a data center, comprising:
a plurality of server chassis arranged in a stack, each server chassis including a plurality of electronic components and one or more cooling modules disposed above the plurality of electronic components, each cooling module including:
a main supply connector and a main return connector connected to external cooling loops,
an internal cooling loop connected to the main supply connector and the main return connector,
a plurality of cooling plates, each of the cooling plates corresponding to one of the plurality of electronic components, each cooling plate having a supply connector, a return connector and a contacting area, a base layer including a plurality of supply sub-connectors and return sub-connectors and a plurality of cooling areas corresponding to the plurality of cooling plates, wherein the plurality of supply sub-connectors and return sub-connectors are connected with the internal cooling loop, wherein each of the plurality of cooling areas is to contact with a contacting area of a corresponding cooling plate and a surface of a corresponding electronic component, wherein each of the plurality of supply sub-connectors is to be connected to a supply connector of the corresponding cooling plate, each return sub-connector of the plurality of return sub-connectors is to be connected to a return connector of the corresponding cooling plate, and a lid with openings for the plurality of supply sub-connectors and return sub-connectors and the plurality of cooling areas in the base layer.

19. The electronic rack of claim 18, wherein each of the plurality of cooling plates is disposed above the base layer and configured to be pushed down to be connected to the base layer by connecting a supply connector and a return connector to a corresponding supply sub-connector and a corresponding return sub-connector in the base layer.

20. The electronic rack of claim 18, wherein each of the plurality of cooling plates is configured to be pulled up to be disconnected from the base layer by disconnecting a supply connector and a return connector from a corresponding supply sub-connector and a corresponding return sub-connector in the base layer.

* * * * *